Figures 4, 7A, 7B, 7C:
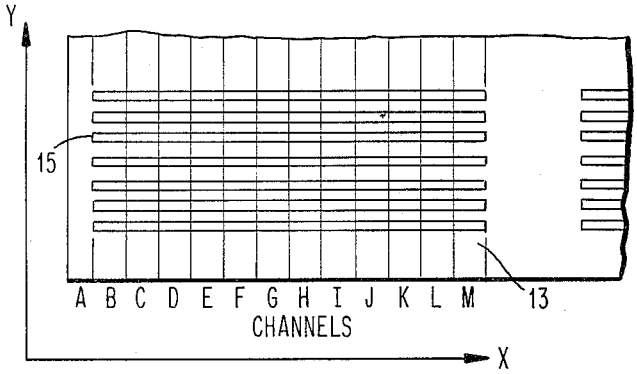
Figure 9:
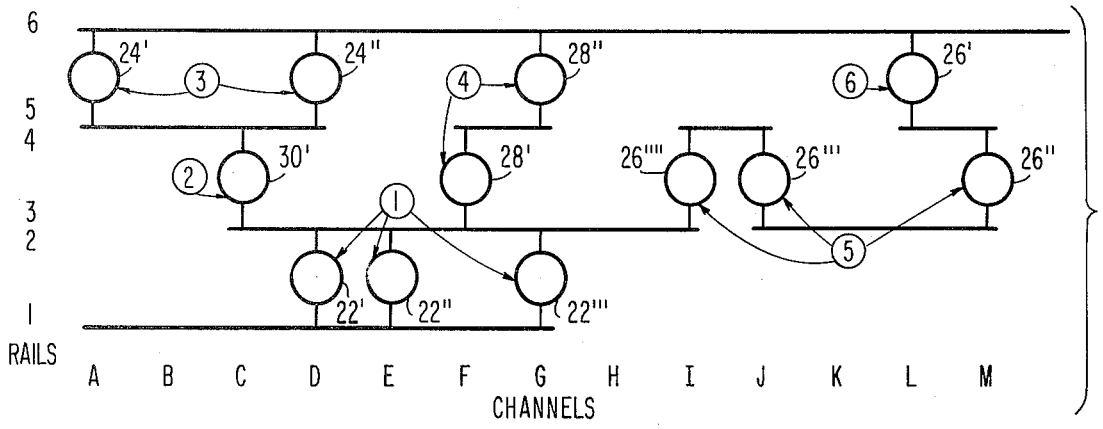
Figure 10:
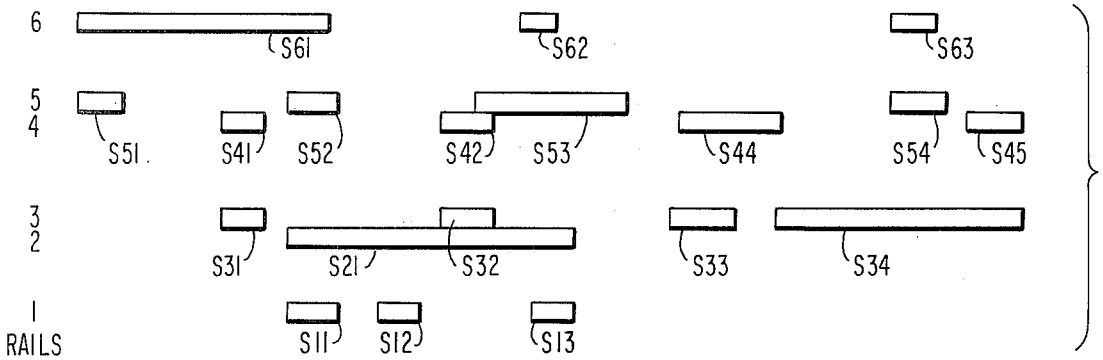
Figure 11:
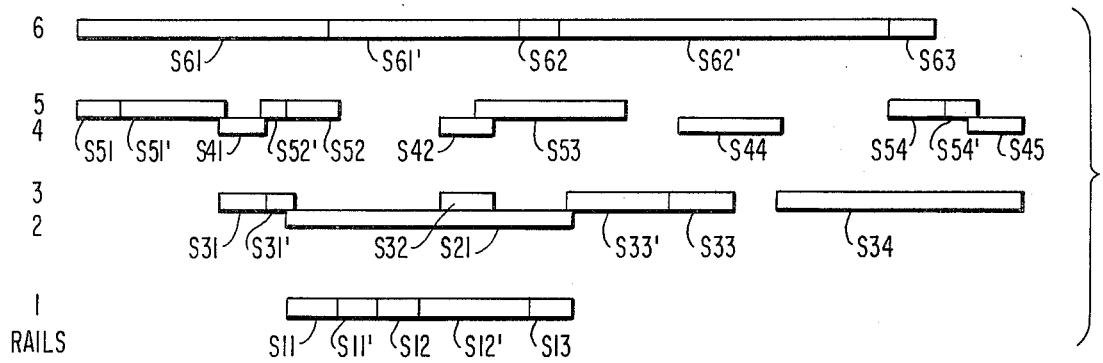
Figure 12A:
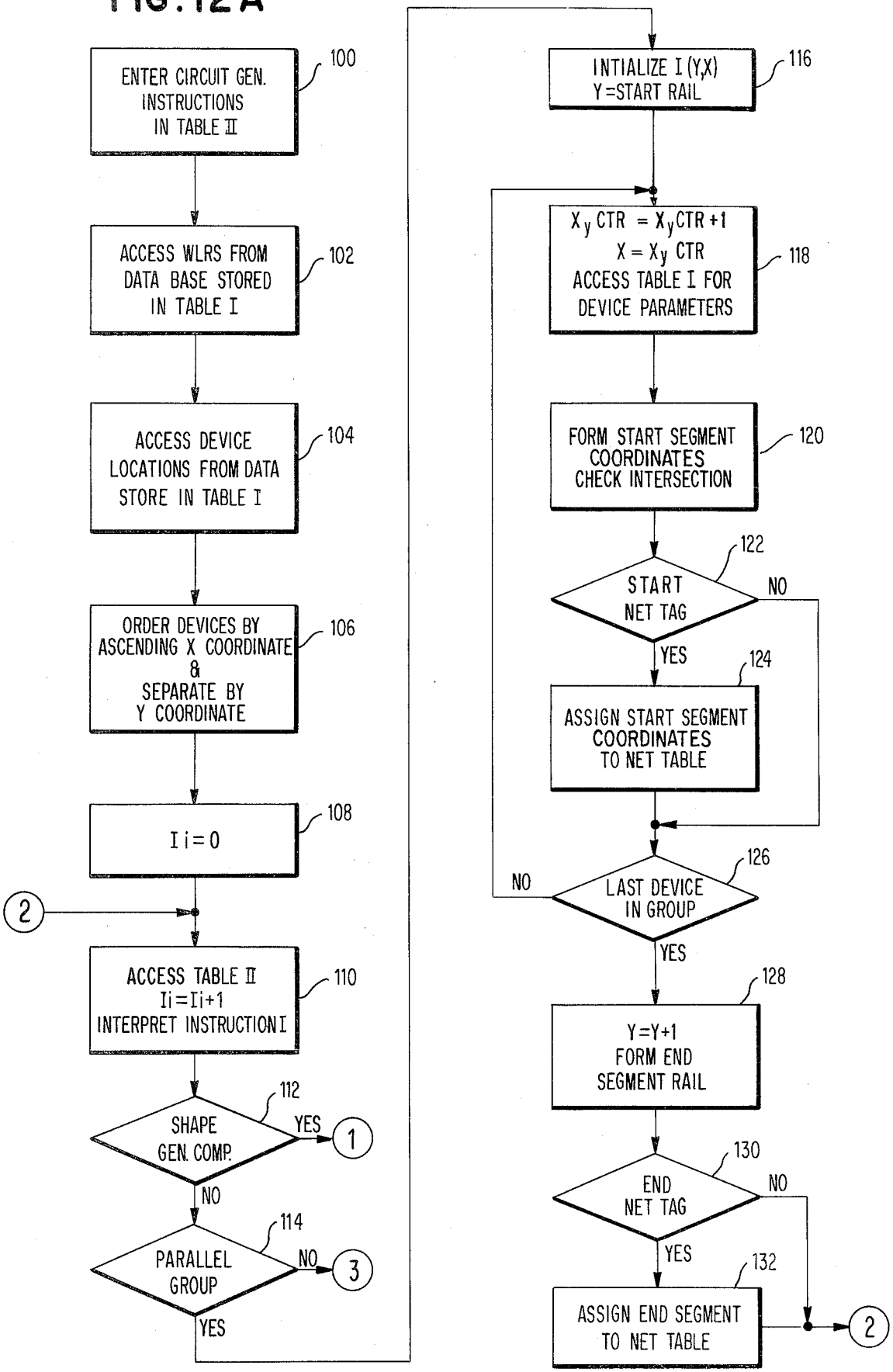
Figure 12B:
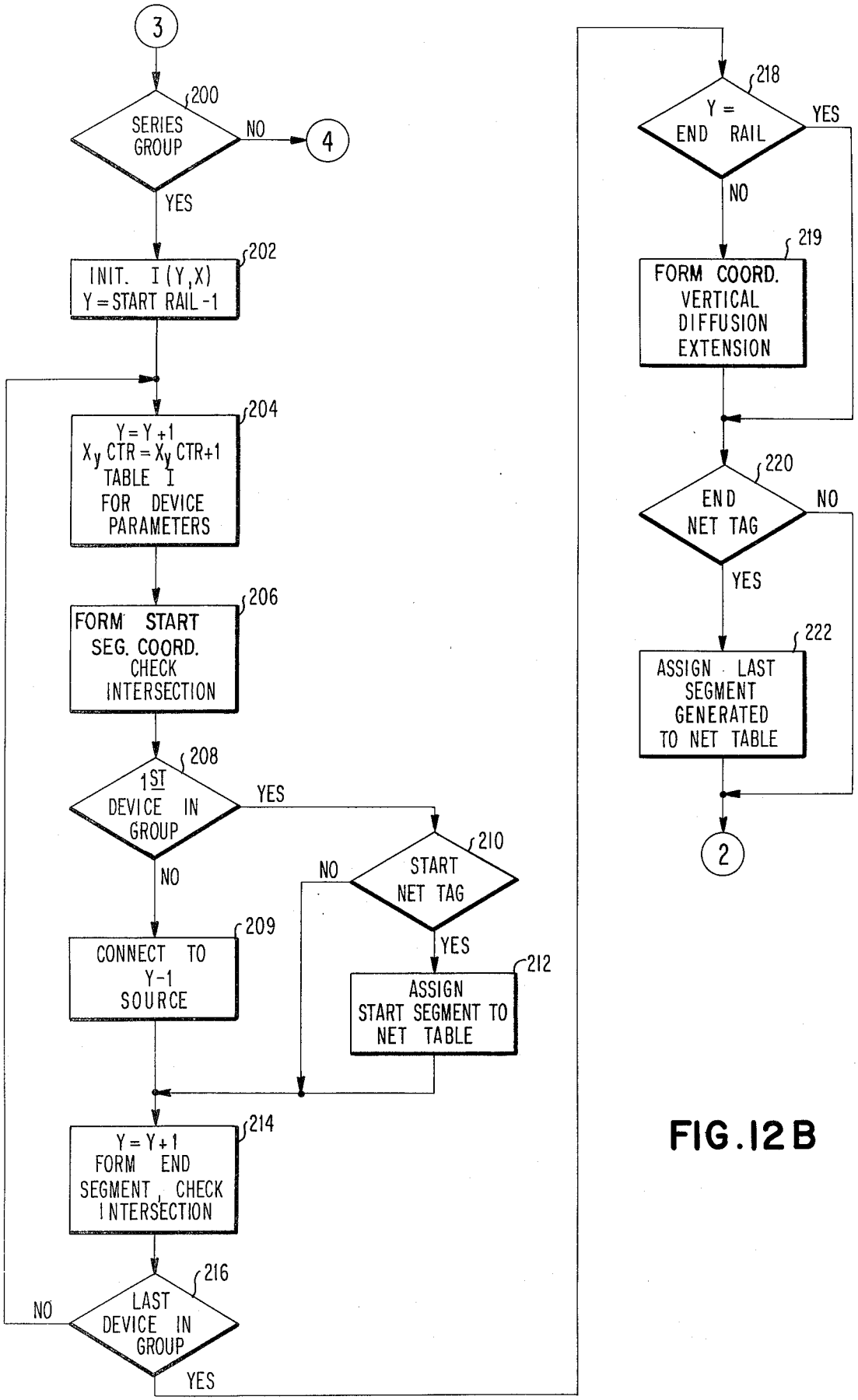
Figure 12C:
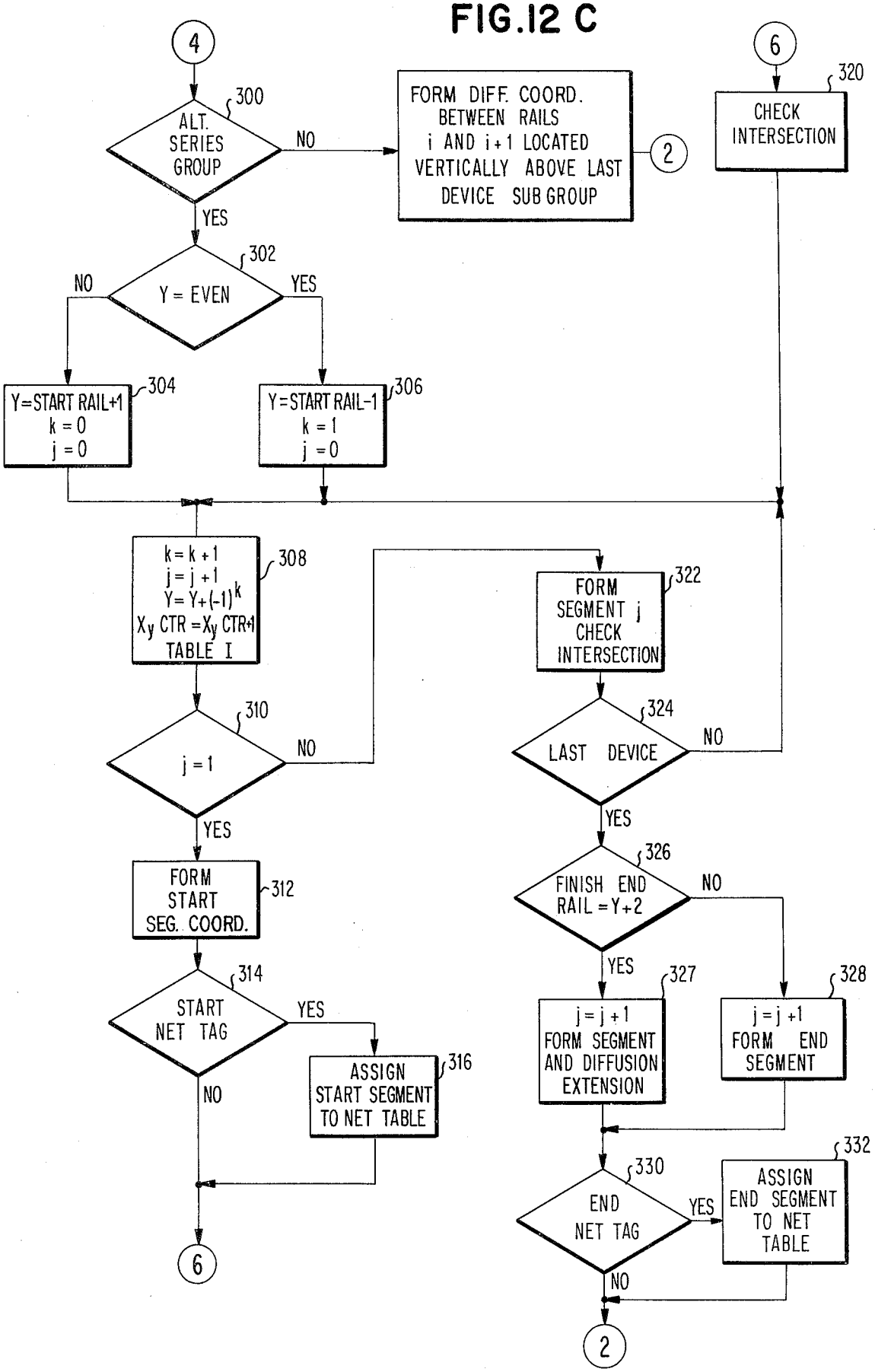
Figure 12D:
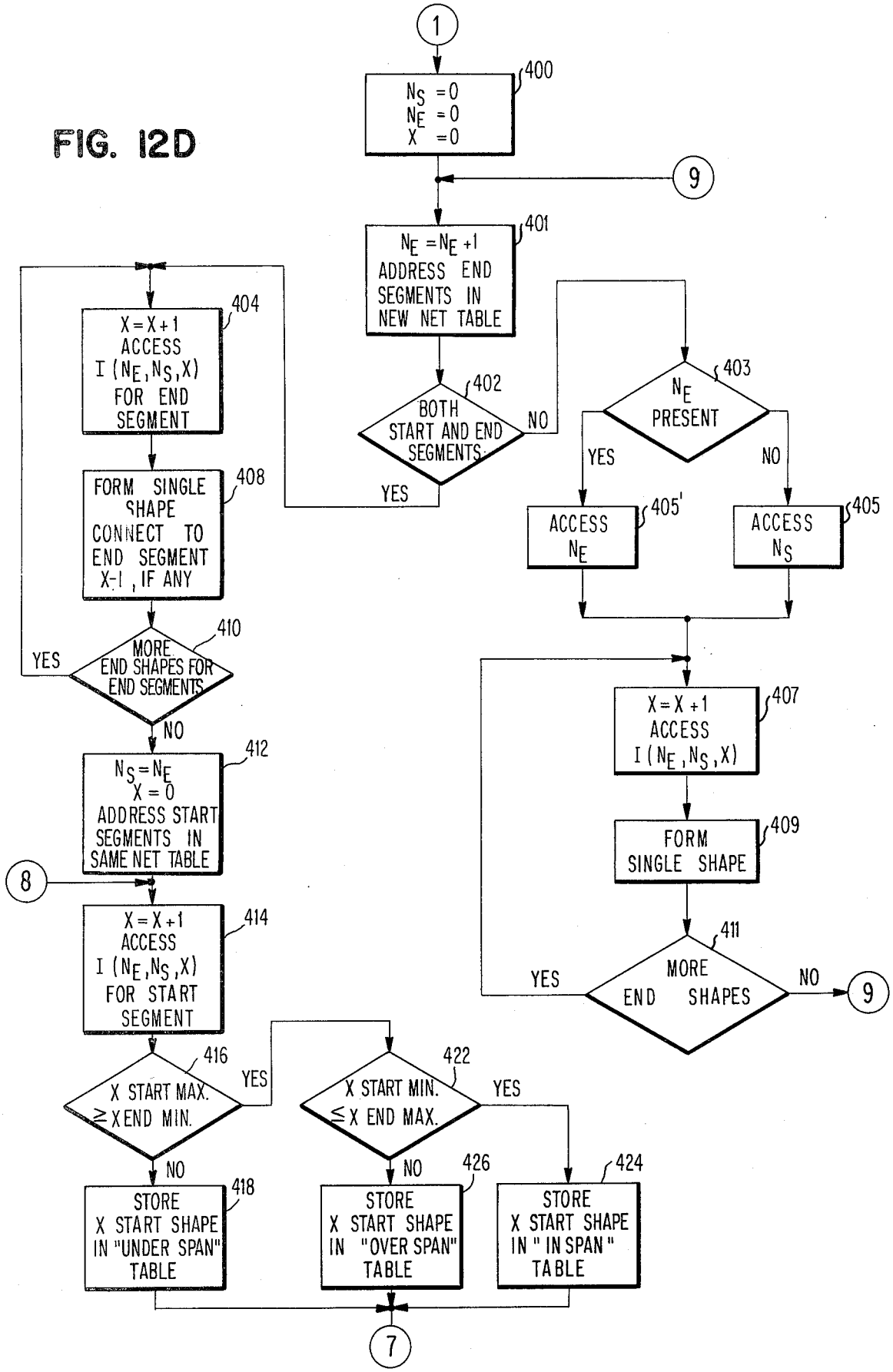
Figure 12E:
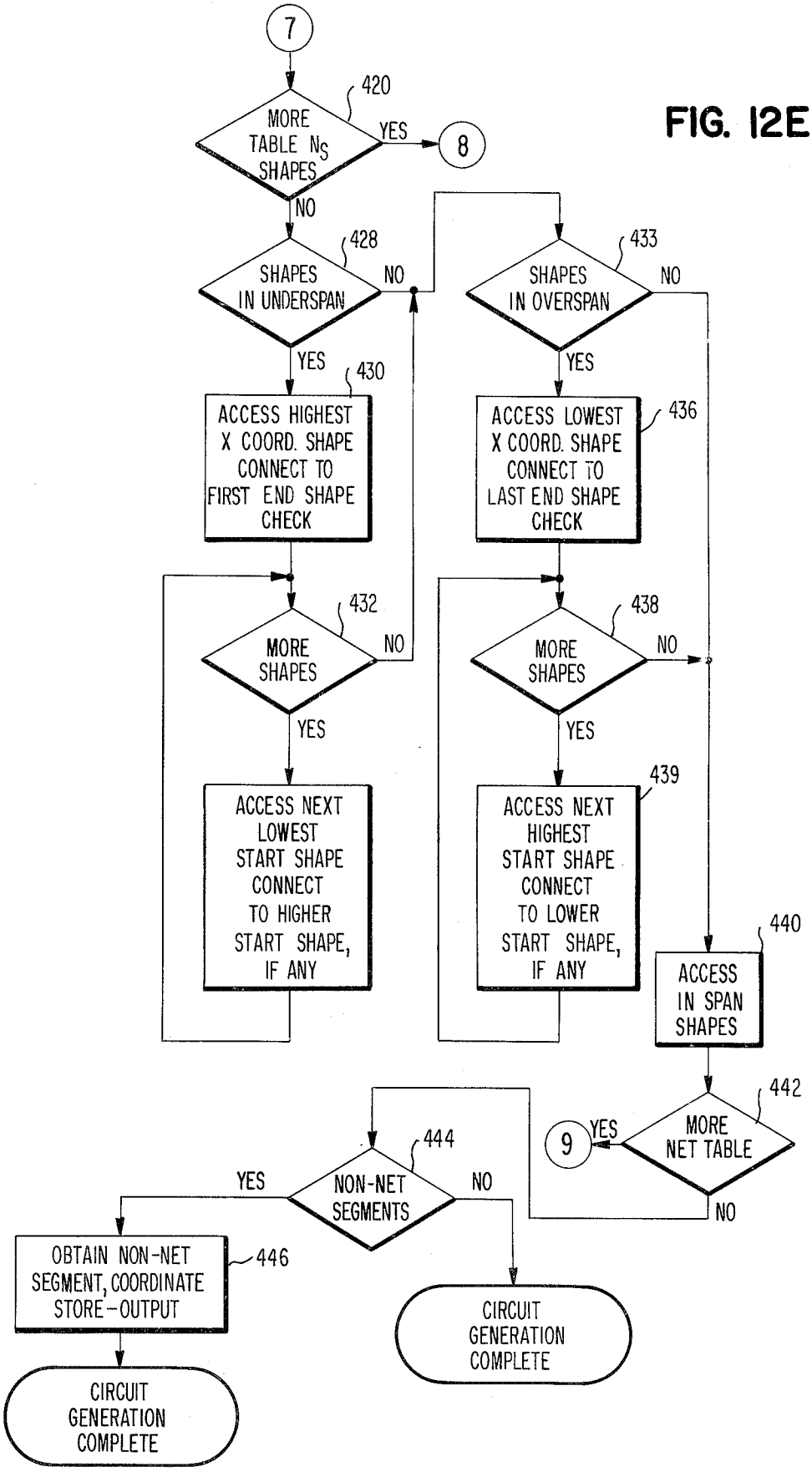
Figure 12F:
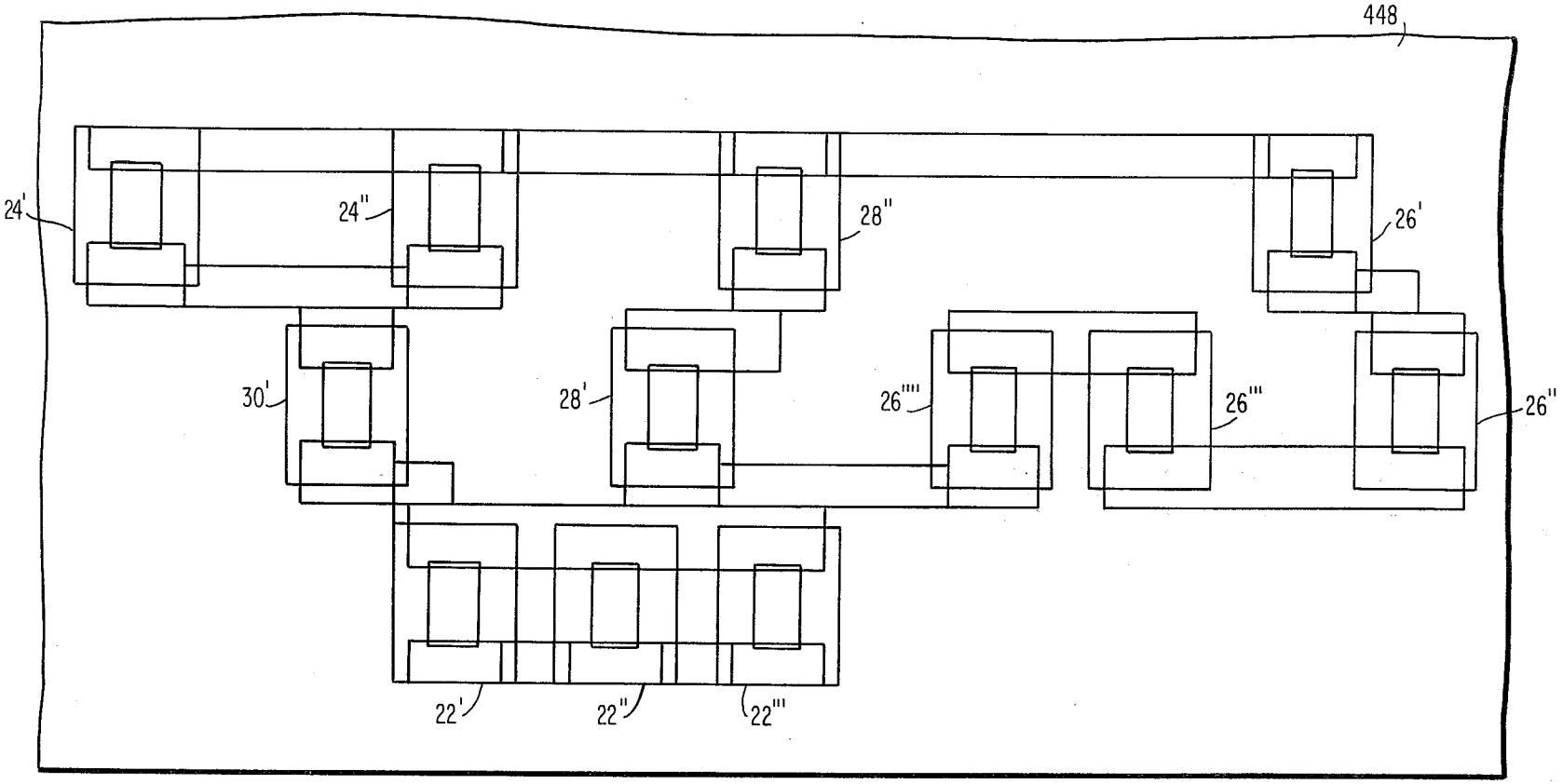

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED NOVEMBER 4, 1975

940 O.G. 11

T940,020

AUTOMATIC CIRCUIT GENERATION PROCESS AND APPARATUS

George E. Brechling, Gaithersburg, Md., and William F. Colton, Woodbridge, Rita R. Marshall, Fairfax, and Walter H. Elder, Vienna, Va., assignors to International Business Machines Corporation, Armonk, N.Y.

Continuation of abandoned application Ser. No. 213,695, Dec. 29, 1971. This application Apr. 17, 1974, Ser. No. 461,774

Int. Cl. G06f *15/20*

U.S. Cl. *444—1*

10 Sheets Drawing. 38 Pages Specification

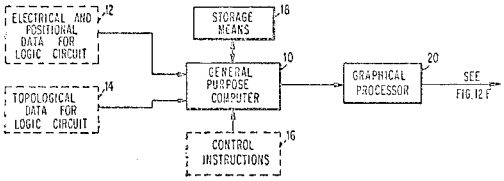

Apparatus and method for automatically generating a topology for a logic circuit to be embodied in a semiconductor wafer. Fixed data, designer originated data and control data are generated as an input to a computer. The fixed data provides electrical, and topological qualities of each logical element in the logic circuit to be embodied in the semiconductor wafer. The designer originated data provides location in an ordered grid layout. The control data describes (1) combinations of logical elements in the logic circuit by type of combination, start and end in the grid array descriptive of the semiconductor wafer and (2) electrically common combinations. A program employs the fixed, designer originated and control data to generate coordinate data for each logical element in the grid array as an input to a graphical processor which translates the coordinates into a topological pattern descriptive of the logic circuit to be embodied in the semiconductor wafer.

FIG.1
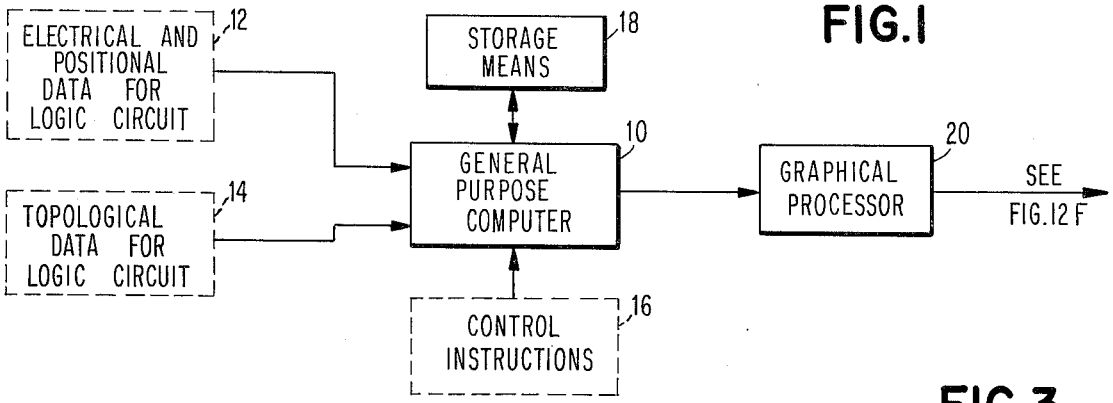
FIG.2
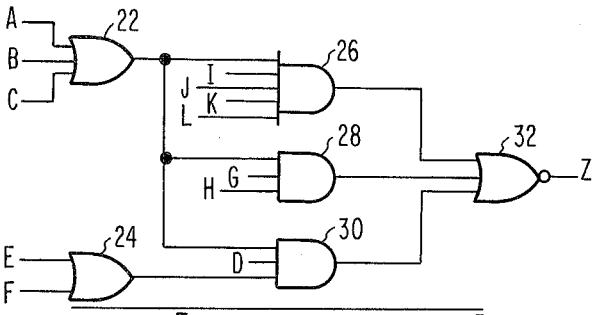
$Z = (A+B+C)\left[D(E+F) + G \cdot H + I \cdot J \cdot K \cdot L\right]$
FIG.3
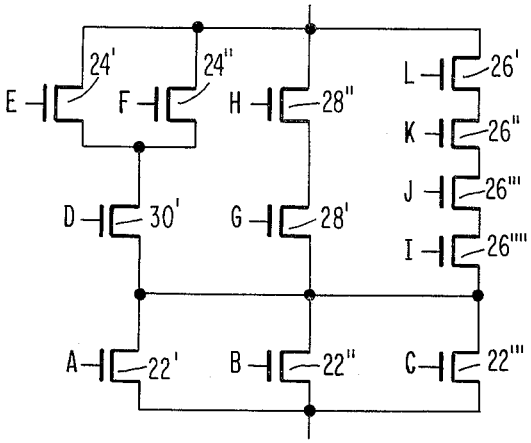
TABLE I
| DEV. | LOCATION | WLR | RAILS |
|---|---|---|---|
| X=1 | CHAN.(C)-D | 5 | Y=1-2 |
| 2 | C-E | 5 | |
| 3 | C-G | 5 | |
| X=1 | C-C | 4 | Y=3-4 |
| 2 | C-F | 3 | |
| 3 | C-I | 5 | |
| 4 | C-J | 5 | |
| 5 | C-M | 5 | |
| X=1 | C-A | 4 | Y=5-6 |
| 2 | C-D | 4 | |
| 3 | C-G | 3 | |
| 4 | C-L | 5 | |
FIG.5
TABLE III
| NET | DEV. | |
|---|---|---|
| $N_S=1$ | X=1 | SEGMENT(S) 11 |
| | 2 | S 12 |
| | 3 | S 13 |
| $N_E=2$ | X=1 | S 21 |
| $N_S=2$ | X=1 | S 31 |
| | 2 | S 32 |
| | 3 | S 33 |
| $N_E=3$ | X=1 | S 41 |
| $N_S=3$ | X=1 | S 51 |
| | 2 | S 52 |
| $N_E=4$ | X=1 | S 61 |
| | 2 | S 62 |
| | 3 | S 63 |
| $N_E=5$ | X=1 | S 45 |
| $N_S=5$ | X=1 | S 54 |
FIG.8

| FIELD | 1 | 2 | 3 | 4 | 5 | 6 |
|---|---|---|---|---|---|---|
| SUB-GROUP | TYPE OF GROUP * | STARTING RAIL No. | ENDING RAIL No. | No. OF FET'S IN GROUP | GROUP START NET No. | GROUP END NET No. |
| 1 | 1 | 1 | 2 | 3 | 1 | 2 |
| 2 | 0 | 3 | 4 | 1 | 2 | 3 |
| 3 | 1 | 5 | 6 | 2 | 3 | 4 |
| 4 | 0 | 3 | 6 | 2 | 2 | 4 |
| 5 | 2 | 3 | 4 | 3 | 2 | 5 |
| 6 | 0 | 5 | 6 | 1 | 5 | 4 |

* 0 = SERIES 1 = PARALLEL 2 = ALT. SERIES 3 = DIFFUSION

| SUB-GROUP | INPUTS |
|---|---|
| 1 | A,B,C |
| 2 | D |
| 3 | E,F |
| 4 | G,H |
| 5 | I,J,K |
| 6 | L |

TABLE II

| INSTR. | | | | | | |
|---|---|---|---|---|---|---|
| i = 1 | 1 | 1 | 2 | 3 | 1 | 2 |
| 2 | 0 | 3 | 4 | 1 | 2 | 3 |
| 3 | 1 | 5 | 6 | 2 | 3 | 4 |
| 4 | 0 | 3 | 6 | 2 | 2 | 4 |
| 5 | 2 | 3 | 4 | 3 | 2 | 5 |
| 6 | 0 | 5 | 6 | 1 | 5 | 4 |
| 7 | 9 | 9 | 9 | 9 | 9 | 9 |

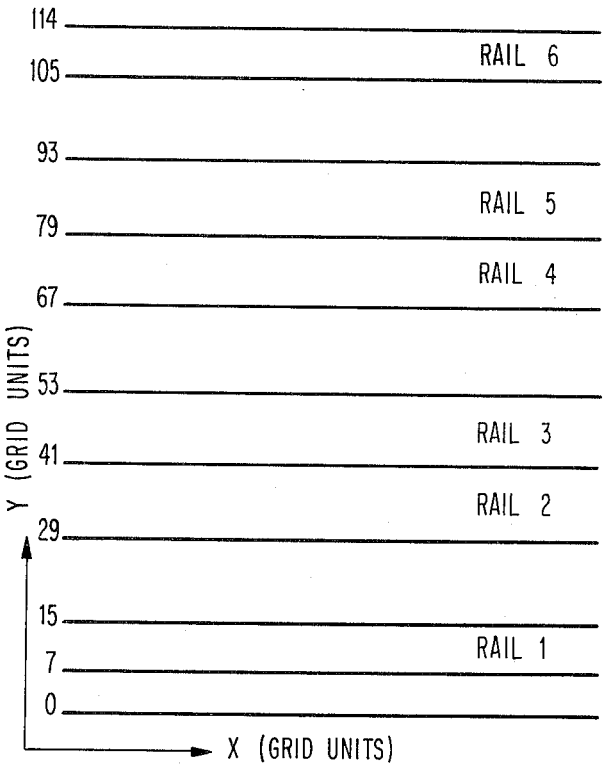
FIG.6A
| RAIL | START Y COORD. (GRID UNITS) | RAIL WIDTH (GRID UNITS) |
|---|---|---|
| 1 | 7 | 8 |
| 2 | 29 | 12 |
| 3 | 41 | 12 |
| 4 | 67 | 12 |
| 5 | 79 | 12 |
| 6 | 105 | 8 |
FIG.6B
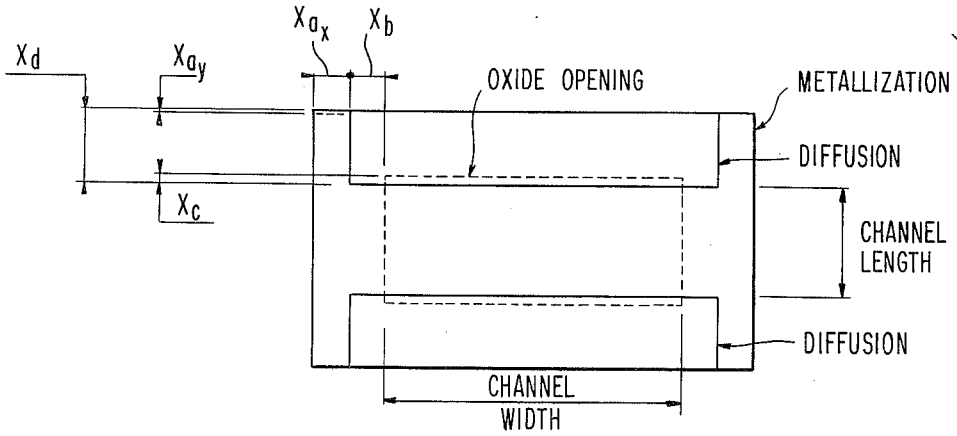
FIG.6C
$X_{a_x}$ _METAL / DIFFUSION OVERLAP (4 GRID UNITS)
$X_b$ _DIFFUSION / OXIDE OVERLAP (4 GRID UNITS)
$X_c$ _OXIDE / DIFFUSION OVERLAP (1 GRID UNIT)
$X_{a_y}$ _DIFFUSION / METAL OVERLAP (0 GRID UNIT)
$X_d$ _DIFFUSION WIDTH (8 GRID UNITS)